United States Patent
Hashemi et al.

(10) Patent No.: US 10,770,461 B2
(45) Date of Patent: Sep. 8, 2020

(54) ENHANCED FIELD RESISTIVE RAM INTEGRATED WITH NANOSHEET TECHNOLOGY

(71) Applicant: International Business Machines Corporation, Armonk, NY (US)

(72) Inventors: Pouya Hashemi, Purchase, NY (US); Takashi Ando, Eastchester, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/675,935

(22) Filed: Nov. 6, 2019

(65) Prior Publication Data
US 2020/0075599 A1    Mar. 5, 2020

Related U.S. Application Data

(62) Division of application No. 15/960,092, filed on Apr. 23, 2018, now Pat. No. 10,504,900.

(51) Int. Cl.
*H01L 27/092* (2006.01)
*H01L 21/82* (2006.01)
(Continued)

(52) U.S. Cl.
CPC .. *H01L 27/0924* (2013.01); *H01L 21/823821* (2013.01); *H01L 27/2436* (2013.01); *H01L 45/1206* (2013.01); *H01L 45/1233* (2013.01)

(58) Field of Classification Search
CPC ......... H01L 27/0924; H01L 21/823821; H01L 27/2436; H01L 45/1206; H01L 45/1233
(Continued)

(56) References Cited

U.S. PATENT DOCUMENTS 7,881,092 B2    2/2011   Ufert
9,437,502 B1 *  9/2016   Cheng .................... B82Y 10/00
(Continued)

OTHER PUBLICATIONS

Pan, H.W., et al.,"1Kbit FINFET Dielectric (FIND) RRAM in Pure 16nm FinFET CMOS Logic Process", Electron Devices Meeting (IEDM), Date of Conference: Dec. 7-9, 2015 IEEE International, 4 pages.

(Continued)

*Primary Examiner* — Didarul A Mazumder
(74) *Attorney, Agent, or Firm* — Scully, Scott, Murphy & Presser, P.C.; L. Jeffrey Kelly, Esq.

(57) ABSTRACT

A semiconductor structure containing a resistive random access memory device integrated with a gate-all-around nanosheet CMOS device is provided. In one embodiment, the semiconductor structure includes a gate-all-around nanosheet CMOS device includes a functional gate structure present on, and between, each semiconductor channel material nanosheet of a nanosheet stack of suspended semiconductor channel material nanosheets. The structure of the present application further includes a resistive memory device located laterally adjacent to the gate-all-around nanosheet CMOS device that includes a second functional gate structure present on, and between, each recessed semiconductor channel material layer portion of a material stack, wherein a recessed sacrificial semiconductor material layer portion is located above and below each recessed semiconductor channel material layer portion. A shared source/drain region is located between the gate-all-around nanosheet CMOS device and the resistive memory device.

20 Claims, 10 Drawing Sheets

(51) Int. Cl.
  *H01L 27/24*       (2006.01)
  *H01L 21/8238*     (2006.01)
  *H01L 45/00*       (2006.01)

(58) Field of Classification Search
  USPC .......................................................... 257/5
  See application file for complete search history.

(56)           References Cited

U.S. PATENT DOCUMENTS 9,653,289 B1 *   5/2017  Balakrishnan ........ H01L 27/088
  9,755,017 B1 *   9/2017  Guillorn ............. H01L 29/0673
  9,768,380 B2     9/2017  Sakuma et al.
  9,818,800 B2    11/2017  Sekar et al.
 10,014,390 B1 *   7/2018  Bouche ............... H01L 29/0665
 2015/0090952 A1   4/2015  Huang
 2016/0020305 A1 * 1/2016  Obradovic .......... H01L 29/7391
                                                         257/39
 2017/0035888 A1   2/2017  Ottoboni et al.
 2017/0365604 A1  12/2017  Suh et al.
 2019/0058052 A1   2/2019  Frougier et al.

OTHER PUBLICATIONS

List of IBM Patents or Patent Applications Treated As Related dated Nov. 6, 2019, 2 pages.

* cited by examiner

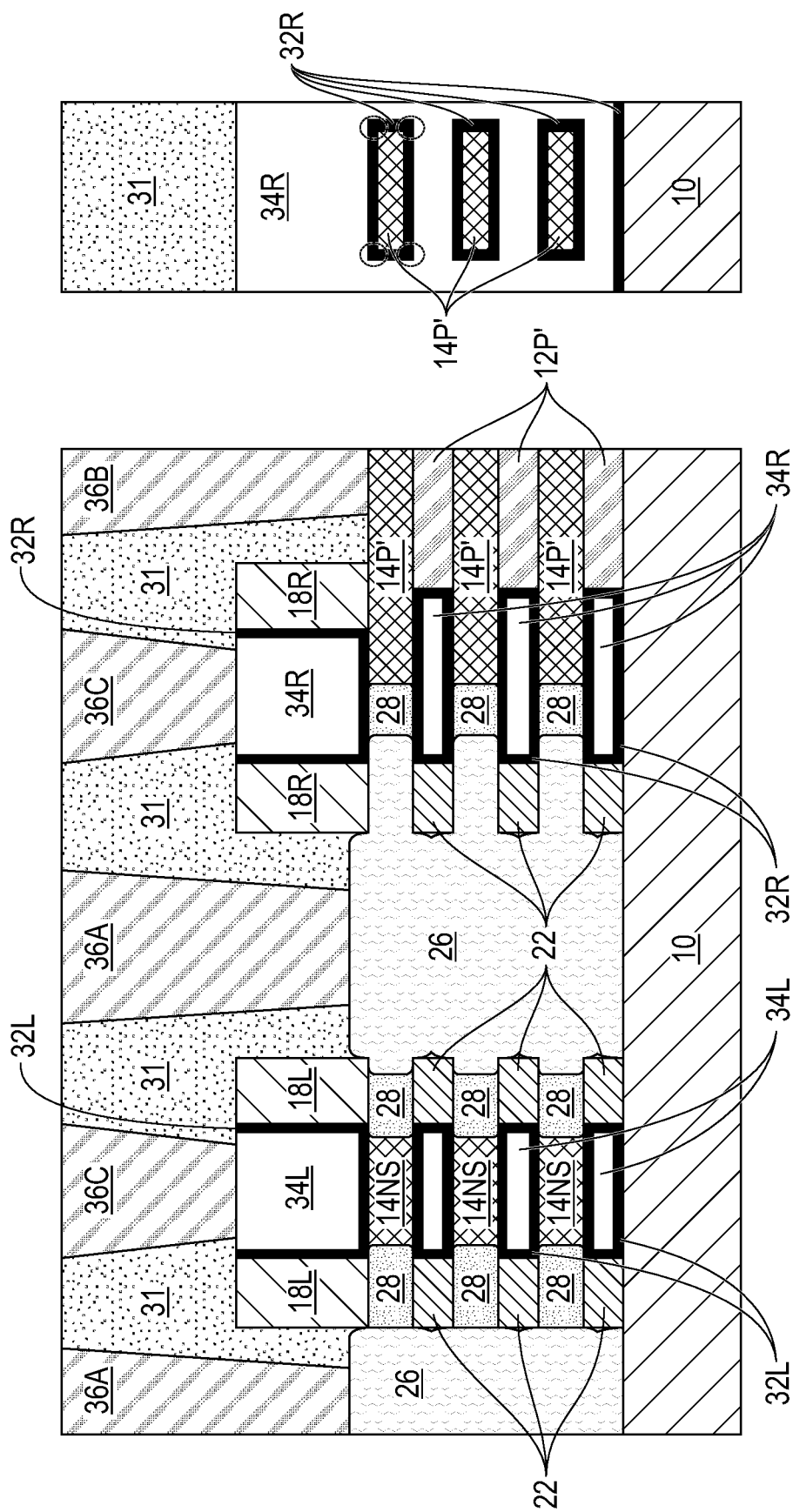

ENHANCED FIELD RESISTIVE RAM INTEGRATED WITH NANOSHEET TECHNOLOGY

BACKGROUND

The present application relates to a semiconductor structure and a method of forming the same. More particularly, the present application relates to a semiconductor structure containing a resistive random access memory device integrated with a gate-all-around nanosheet complementary metal-oxide-semiconductor (CMOS) device.

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

For oxide ReRAMs, electroforming of a current conducting filament is needed. This process relies on randomness and thus the position of the filament of the oxide ReRAM is not well controlled. This results in a higher forming voltage as the ReRAM cell is scaled and higher device variability.

Also, the use of non-planar semiconductor devices such as, for example, semiconductor fin field effect transistors (FinFETs) is the next step in the evolution of CMOS devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

In view of the above, there is need to provide a semiconductor structure containing a resistive random access memory device integrated with a nanosheet containing device (i.e., a gate-all-around nanosheet CMOS device).

SUMMARY

In one aspect of the present application, a semiconductor structure containing a resistive random access memory device integrated with a gate-all-around nanosheet CMOS device is provided. In one embodiment, the semiconductor structure includes a gate-all-around nanosheet CMOS device including a first functional gate structure present on, and between, each semiconductor channel material nanosheet of a nanosheet stack of suspended semiconductor channel material nanosheets. The structure of the present application further includes a resistive memory device located laterally adjacent to the gate-all-around nanosheet CMOS device and including a second functional gate structure present on, and between, each recessed semiconductor channel material layer portion of a material stack, wherein a recessed sacrificial semiconductor material layer portion is located above and below each recessed semiconductor channel material layer portion. A shared source/drain region is located between the gate-all-around nanosheet CMOS device and the resistive memory device.

In another aspect of the present application, a method of forming a semiconductor structure containing a resistive random access memory device integrated with a gate-all-around nanosheet CMOS device is provided. In one embodiment, the method includes providing a fin structure comprising a vertical stack of alternating layers of a sacrificial semiconductor material layer and a semiconductor channel material layer located on a surface of a semiconductor substrate, and a first sacrificial gate structure and a second sacrificial gate structure located on different portions of the fin structure. A first mask is formed that partially covers the second sacrificial gate structure. Physically exposed portions of the fin structure are then etched to provide a nanosheet stack comprised of alternating nanosheets of a sacrificial semiconductor material nanosheet and a semiconductor channel material nanosheet beneath the first sacrificial gate structure, and a material stack of alternating layers of a sacrificial semiconductor material layer portion and a semiconductor channel material layer portion beneath the second sacrificial gate structure and the first mask. Each sacrificial semiconductor material nanosheet of the nanosheet stack and each sacrificial semiconductor material layer portion of the material stack are then recessed, and an inner spacer is formed within a gap formed by the recessing. A second mask is formed protecting the first sacrificial gate structure, the nanosheet stack, the inner spacers formed within the gap formed by recessing the sacrificial semiconductor material nanosheets of the nanosheet stack. Next, the semiconductor channel material layer portions of the material stack are recessed, and thereafter the second mask is removed. A source/drain (S/D) region is then formed on physically exposed sidewalls of each semiconductor channel material nanosheet of the nanosheet stack and each recessed semiconductor channel material layer portion of the material stack, and thereafter the first mask is removed. The first and second sacrificial gate structures, each recessed sacrificial semiconductor material nanosheet and a portion of each recessed sacrificial semiconductor material layer portion are removed, and thereafter a first functional gate structure is formed wrapping around each suspended semiconductor channel material nanosheet, and a second functional gate structure is formed on exposed surfaces of each recessed semiconductor channel material layer portion of the material stack.

BRIEF DESCRIPTION OF SEVERAL VIEWS OF THE DRAWINGS

FIG. 10 is a cross sectional view of the exemplary semiconductor structure of FIG. 9 after forming additional ILD material and forming S/D contact structures, gate contact structures, and a dummy contact structure.

FIG. 11 is a cross sectional view of the exemplary structure of FIG. 10 across the recessed semiconductor channel material layer portions illustrating the high field corners of the resistive memory device of the present application.

DETAILED DESCRIPTION

Figure 1:
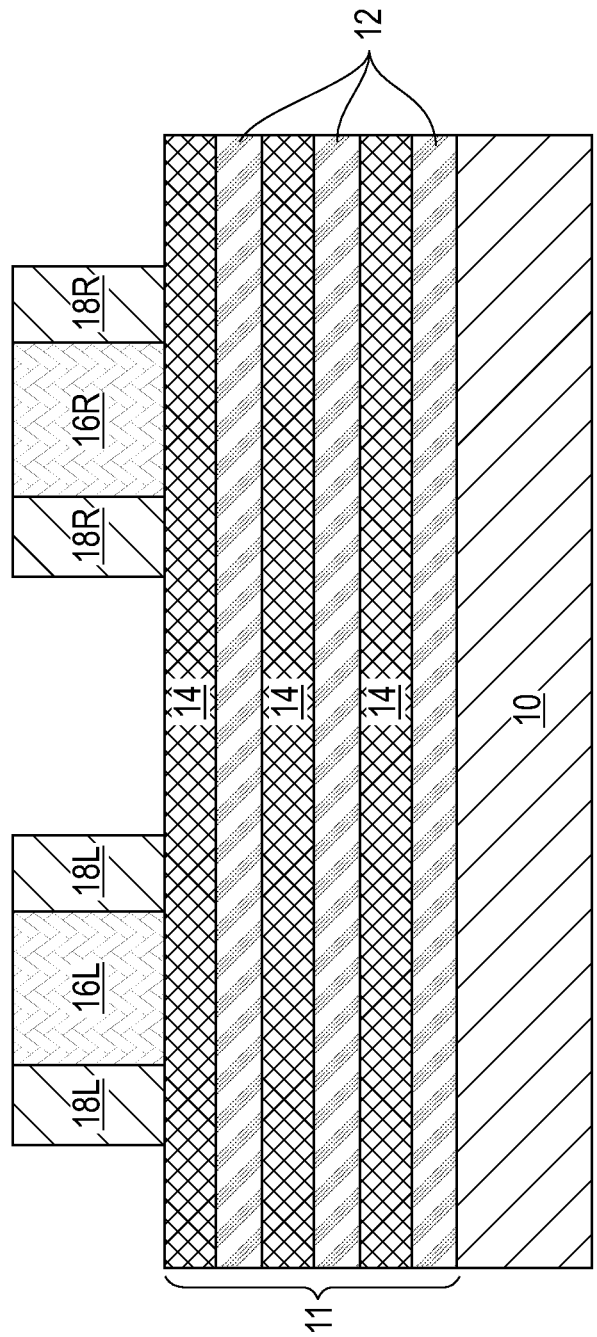
FIG. 1 is a cross sectional view of an exemplary semiconductor structure of the present application and during an early stage of fabrication, the exemplary structure including a fin structure comprising a vertical stack of alternating layers of a sacrificial semiconductor material layer and a semiconductor channel material layer located on a surface of a semiconductor substrate, and a first sacrificial gate structure and a second sacrificial gate structure located on different portions of the fin structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application and during an early stage of fabrication. The exemplary semiconductor structure of FIG. 1 includes a fin structure 11 located on a surface of semiconductor substrate 10. The fin structure 11 includes a vertical stack of alternating layers of a sacrificial semiconductor material layer 12 and a semiconductor channel material layer 14. The exemplary structure of FIG. 1 further includes a first sacrificial gate structure 16L and a second sacrificial gate structure 16R located on different portions of the fin structure 11.

In accordance with the present application, the first sacrificial gate structure 16L is located in a region in which a gate-all-around nanosheet CMOS device will be subsequently formed, while the sacrificial gate structure 16R is located in a region in which a resistive random access memory device will be subsequently formed.

The semiconductor substrate 10 may include any semiconductor material that has semiconducting properties. The semiconductor material that provides semiconductor substrate 10 may include, for example, silicon (Si), germanium (Ge), a silicon germanium alloy (SiGe), silicon carbide (SiC), silicon germanium carbide (SiGeC), a III-V compound semiconductor or a II-VI compound semiconductor.

Fin structure 11 is then formed on the semiconductor substrate 10. Although a single fin structure 11 is described and illustrated, a plurality of fin structures each containing a vertical stack of alternating layers of a sacrificial semiconductor material layer 12 and a semiconductor channel material layer 14 can be formed. In such an embodiment, each fin structure is orientated parallel to one another.

The formation of the fin structure 11 includes forming a semiconductor material stack upon the semiconductor substrate 10 and then patterning the semiconductor material stack to form the fin structure 11. Patterning may be performed by lithography and etching or any other patterning method known to those skilled in the art including, for example, a sidewall-image transfer (SIT) process.

The term "fin structure" denotes a continuous structure including a pair of vertical sidewalls that are parallel to each other. As used herein, a surface is "vertical" if there exists a vertical plane from which the surface does not deviate by more than three times the root mean square roughness of the surface. The fin structure 11 may have a height from 10 nm to 100 nm, a width from 4 nm to 30 nm, and a length from 100 nm to 2000 nm. Other heights and/or widths and/or lengths may also be used as the dimensions of fin structure 11.

The semiconductor material stack that is employed in forming the fin structure 11 is composed of alternating layers of the sacrificial semiconductor material layer 12 and the semiconductor channel material layer 14 which alternate one atop the other; the alternating layers of the sacrificial semiconductor material layer 12 and the semiconductor channel material layer 14 are also present in the fin structure 11. In one example, the semiconductor material stack includes three sacrificial semiconductor material layers 12 and three semiconductor channel material layers 14. The semiconductor material stack that can be employed in the present application is not limited to such a semiconductor material stack. Instead, the semiconductor material stack can include any number of sacrificial material layers and corresponding semiconductor channel material layers.

Each sacrificial semiconductor material layer 12 is composed of a first semiconductor material which differs in composition from at least an upper portion of the semiconductor substrate 10. In one embodiment, the upper portion of the semiconductor substrate 10 is composed of silicon, while each sacrificial semiconductor material layer 12 is composed of a silicon germanium alloy. The first semiconductor material that provides each sacrificial semiconductor material layer 12 can be formed utilizing an epitaxial growth (or deposition process) as defined in greater detail herein below.

Each semiconductor channel material layer 14 is composed of a second semiconductor material that has a different etch rate than the first semiconductor material that provides the sacrificial semiconductor material layers 12. The second semiconductor material that provides each semiconductor channel material layer 14 may be the same as, or different from, the semiconductor material that provides at least the upper portion of the semiconductor substrate 10. In one example, at least the upper portion of the semiconductor substrate 10 and each semiconductor channel material layer 14 is composed of Si or a III-V compound semiconductor, while each sacrificial semiconductor material layer 12 is composed of a silicon germanium alloy. The second semiconductor material that provides each semiconductor channel material layer 14 can be formed utilizing an epitaxial growth (or deposition process) as defined in greater detail herein below.

The semiconductor material stack can be formed by sequential epitaxial growth of alternating layers of the first semiconductor material and the second semiconductor material. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well known precursor gas or gas mixture. Carrier gases like hydrogen, nitrogen, helium and argon can be used.

The sacrificial semiconductor material layers 12 may have a thickness from 5 nm to 12 nm, while the semiconductor channel material layers 14 may have a thickness from 5 nm to 12 nm. Each sacrificial semiconductor material layer 12 may have a thickness that is the same as, or different from, a thickness of each semiconductor channel material layer 14.

After providing the fin structure 11, the first and second sacrificial gate structures 16L, 16R can be formed. Each sacrificial gate structure (16L, 16R) is located on a first side and a second side of the fin structure 11, and spans across a topmost surface of a portion of the fin structure 11. Each sacrificial gate stack (16L, 16R) thus straddles over a portion of the fin structure 11. A gate spacer (18L, 18R) is present on the sidewalls of each sacrificial gate structure (16L, 16R); the gate spacers (18L, 18R) also straddle over the fin structure 11. It is noted that in the drawings of the present application, the sacrificial gate structures (16L, 16R) and gate spacers (18L, 18R) are only shown as being present atop, not along sidewalls, of the fin structure. In the present application, element 18L represents a first gate spacer that is formed on the sidewalls of the first sacrificial gate structure 16L, while element 18R represents a second gate spacer that is formed on the sidewalls of the second sacrificial gate structure 16R.

Each sacrificial gate structure (16L, 16R) may include a single sacrificial material or a stack of two or more sacrificial materials (i.e., each sacrificial gate structure (16L, 16R) includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the each sacrificial gate structure 16L, 16R.

Each gate spacer (18L, 18R) can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching. At this point of the present application, each gate spacer (18L, 18R) has a topmost surface that can be coplanar with a topmost surface of each sacrificial gate structure (16L, 16R).

Figure 2:
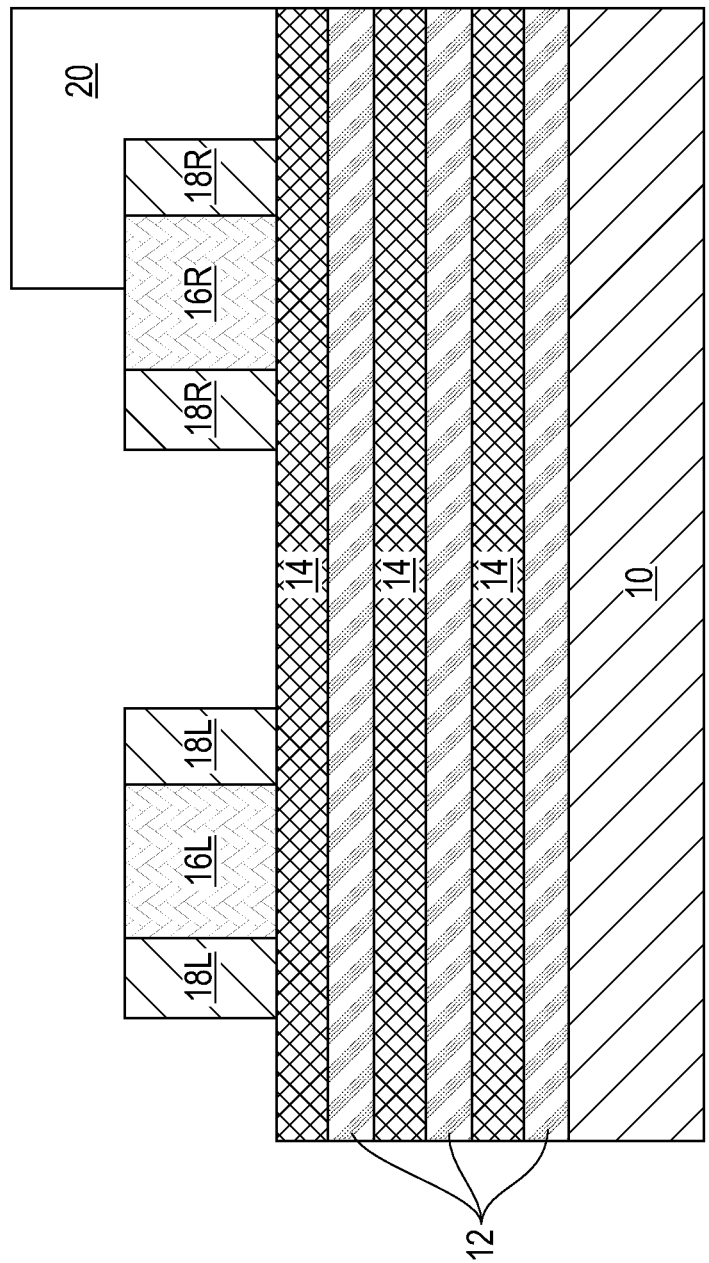
FIG. 2 is a cross sectional view of the exemplary semiconductor structure of FIG. 1 after forming a first mask partially covering the second sacrificial gate structure.

Referring now to FIG. 2, there is illustrated the exemplary semiconductor structure of FIG. 1 after forming a first mask 20 partially covering the second sacrificial gate structure 16R. The first mask 20 is composed of a dielectric hard mask material that is compositionally different from the dielectric spacer material that provides each gate spacer (18L, 18R). In one example, and when silicon nitride is employed as the dielectric spacer material, silicon dioxide may be employed as the dielectric hard mask material. The first mask 20 can be formed by depositing the dielectric hard mask material and then patterning the deposited dielectric hard mask material by lithography and etching. The depositing the hard mask material may include any deposition process such as, for example, chemical vapor deposition or plasma enhanced chemical vapor deposition. As is shown, the first mask 20 protects a first side of the second sacrificial gate structure 16R that is opposite to a second side of the second gate structure 16R that is laterally adjacent to, and facing, the first sacrificial gate structure 16L. First mask 20 may protect a sidewall of the material stack, MS, not facing the first sacrificial gate structure 16L.

Figure 3:
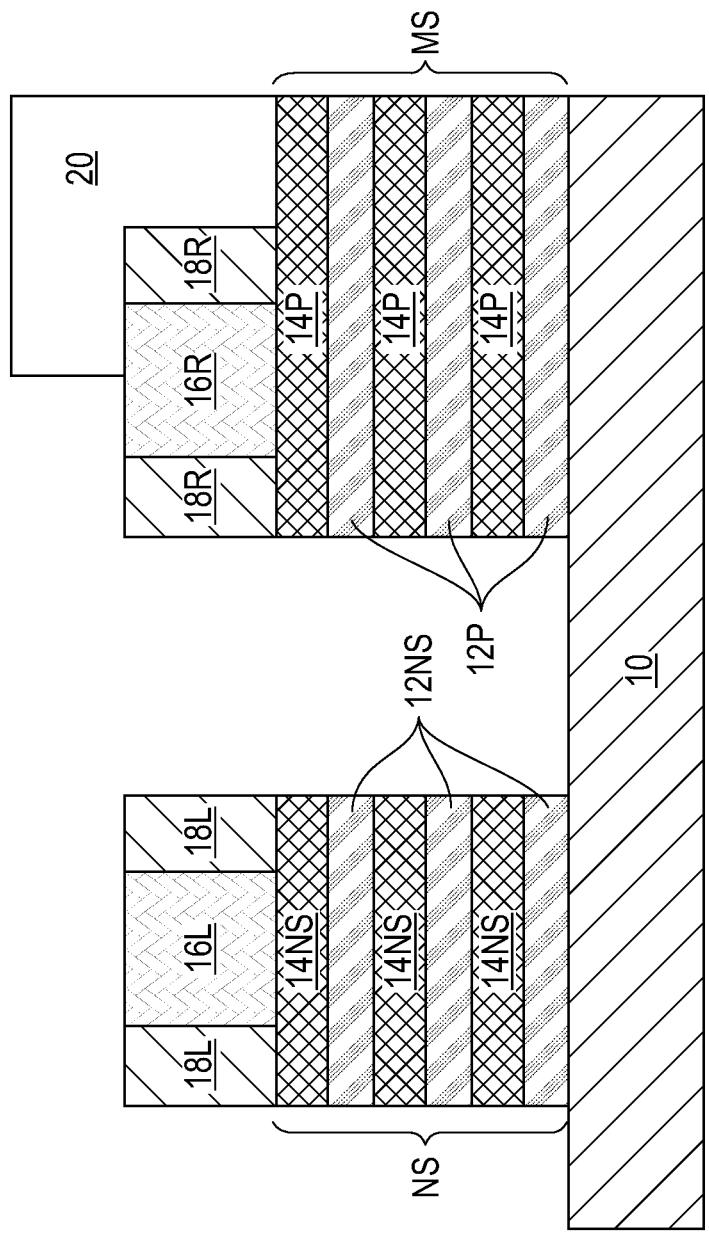
FIG. 3 is a cross sectional view of the exemplary semiconductor structure of FIG. 2 after etching physically exposed portions of the fin structure to provide a nanosheet stack comprised of remaining portions of the sacrificial semiconductor material layers (hereinafter "sacrificial semiconductor material nanosheets") and the semiconductor channel material layers (hereinafter "semiconductor channel material nanosheets") beneath the first sacrificial gate structure, and a material stack comprised of remaining portions of the sacrificial semiconductor material layers (hereinafter "sacrificial semiconductor material layer portions") and the semiconductor channel material layers (hereinafter "semiconductor channel material layer portions") beneath the second sacrificial gate structure and the first mask.

Referring now to FIG. 3, there is illustrated the exemplary semiconductor structure of FIG. 2 after etching physically exposed portions of the fin structure 11 to provide a nanosheet stack, NS, comprised of remaining portions of the sacrificial semiconductor material layers 12 (hereinafter, sacrificial semiconductor material nanosheets 12NS) and the semiconductor channel material layers 14 (hereinafter, semiconductor channel material nanosheets 14NS) beneath the first sacrificial gate structure 16L and the first spacer 18L, and a material stack, MS, comprised of remaining portions of the sacrificial semiconductor material layers 12 (hereinafter, sacrificial semiconductor material layer portions 12P) and the semiconductor channel material layers 14 (hereinafter, semiconductor channel material layer portions 14P) beneath the second sacrificial gate structure 16R, the first mask 20 and the second gate spacer 18R. The recessing of the fin structure 11 can be performed utilizing an anisotropic etching process such as, for example, reactive ion etching (RIE).

Each sacrificial semiconductor material nanosheets 12NS and each semiconductor channel material nanosheet 14NS that constitutes the nanosheet stack, NS, has a thickness as mentioned above for the individual sacrificial semiconductor material layers 12 and semiconductor channel material layers 14, and a width that is equal to the combined width of the first gate spacer 18L and the first sacrificial gate structure 16L. At this point of the present application and as illustrated in FIG. 3, the sidewalls of each sacrificial semiconductor material nanosheet 12NS are vertically aligned to sidewalls of each semiconductor channel material nanosheet 14NS, and the vertically aligned sidewalls of the nanosheet stack, NS, are vertically aligned to an outmost sidewall of the first dielectric spacer 18L.

Each sacrificial semiconductor material layer portion 12P and each semiconductor channel material layer portion 14P that constitutes the material stack, MS, has a thickness as mentioned above for the individual sacrificial semiconductor material layers 12 and semiconductor channel material layers 14, and a width that is equal to the combined width of the second gate spacer 18R, the second sacrificial gate structure 16R and the first mask 20. At this point of the present application and as illustrated in FIG. 3, the sidewalls of each sacrificial semiconductor material layer portion 12P are vertically aligned to sidewalls of each semiconductor channel material layer portion 14P, and one of the vertically aligned sidewalls of the material stack, MS, is vertically aligned to an outmost sidewall of the second dielectric spacer 18R.

Figure 4:
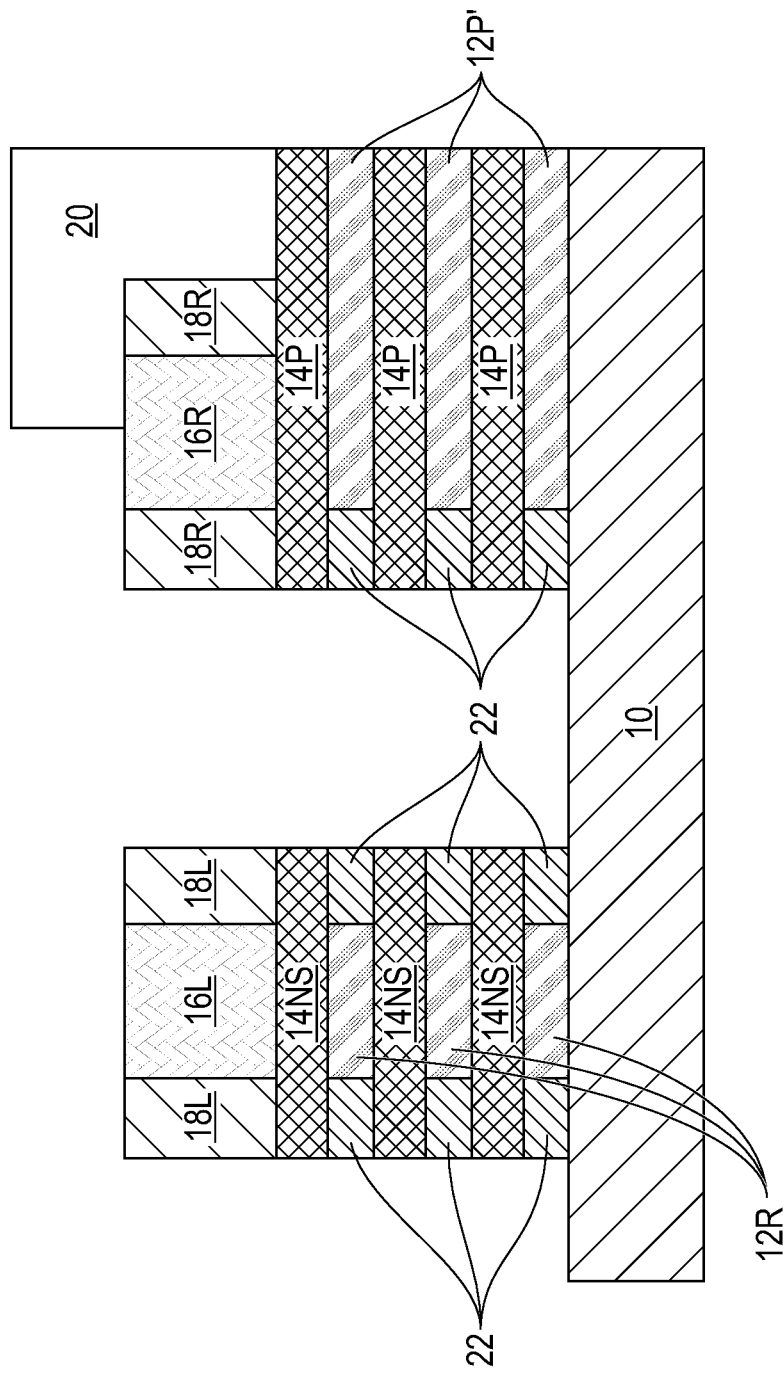
FIG. 4 is a cross sectional view of the exemplary semiconductor structure of FIG. 3 after recessing each sacrificial semiconductor material nanosheet of the nanosheet stack and each sacrificial semiconductor material layer portion of the material stack, and forming an inner spacer within a gap formed by the recessing.

Referring now to FIG. 4, there is illustrated the exemplary semiconductor structure of FIG. 3 after recessing each sacrificial semiconductor material nanosheet 12NS of the nanosheet stack, NS, and each sacrificial semiconductor material layer portion 12P of the material stack, MS, and forming an inner spacer 22 within a gap formed by the recessing.

The recessing of each sacrificial semiconductor material nanosheet 12NS of the nanosheet stack, NS, and each sacrificial semiconductor material layer portion 12P of the material stack, MS, may be performed utilizing a lateral etching process that is selective in removing physically exposed end portions of each sacrificial semiconductor material nanosheet 12NS, and each sacrificial semiconductor material layer portion 14P, relative to each semiconductor channel material nanosheet 14NS and each semiconbductir channel material layer portion 14P.

In accordance with the present application, lateral etching of the sacrificial semiconductor material nanosheet 12NS occurs inward from both sidewalls of the sacrificial semiconductor material nanosheet 12NS, while lateral etching of the sacrificial semiconductor material layer portions 12P occurs only from a sidewall of the sacrificial semiconductor material layer portions that faces the first sacrificial gate structure 16L.

Each recessed sacrificial semiconductor material nanosheet 12NS is designated as element 12R in the drawings of the present application, and each recessed sacrificial semiconductor material layer portion is designed as element 12P' in the drawings of the present application. Each recessed sacrificial semiconductor material nanosheet 12R has a width that is less than the original width of each sacrificial semiconductor material nanosheet 12NS, while each recessed sacrificial semiconductor material layer portion 12P' has a width that is less than the original width of each sacrificial semiconductor material layer portion 12P. The recessing of each sacrificial semiconductor material nanosheet 12NS provides a gap (not specifically shown) between each neighboring pair of vertically stacked semiconductor channel material nanosheets 14NS within nanosheet stack, NS, while the recessing of each sacrificial semiconductor material layer portion 14P provides a gap (not specifically shown) between each neighboring pair of vertically stacked semiconductor channel material layer portions 14P within material stack, MS.

The inner spacer 22 is then formed within the gaps by depositing an inner dielectric spacer material and etching the deposited inner dielectric spacer material. The inner dielectric spacer material that provides each inner spacer 22 is composed of a dielectric material that is compositionally different from the dielectric hard mask material that provides the first mask 20. In one example, the inner dielectric spacer material is composed of silicon nitride. As is shown, the inner spacer 22 that is formed in the gaps between each neighboring pair of vertically stacked semiconductor channel material nanosheets 14NS directly contacts a sidewall of one of the recessed sacrificial semiconductor material nanosheets 12R, while the inner spacer 22 that is formed in the gaps between each neighboring pair of vertically stacked semiconductor channel material layer portions 14P directly contacts a sidewall of one of the recessed sacrificial semiconductor material layer portions 12P'.

The inner spacer 22 that is formed in the gap between each neighboring pair of vertically stacked semiconductor channel material nanosheets 14NS has an outermost sidewall that is vertically aligned to the outermost sidewall of each semiconductor channel material nanosheet 14NS, while the inner spacer 22 that is formed in the gap between each neighboring pair of vertically stacked semiconductor channel material layer portions 14P has an outermost sidewall that is vertically aligned to the outermost sidewall of each semiconductor channel material layer portion 14P that faces the first sacrificial gate structure 16L.

Figure 5:
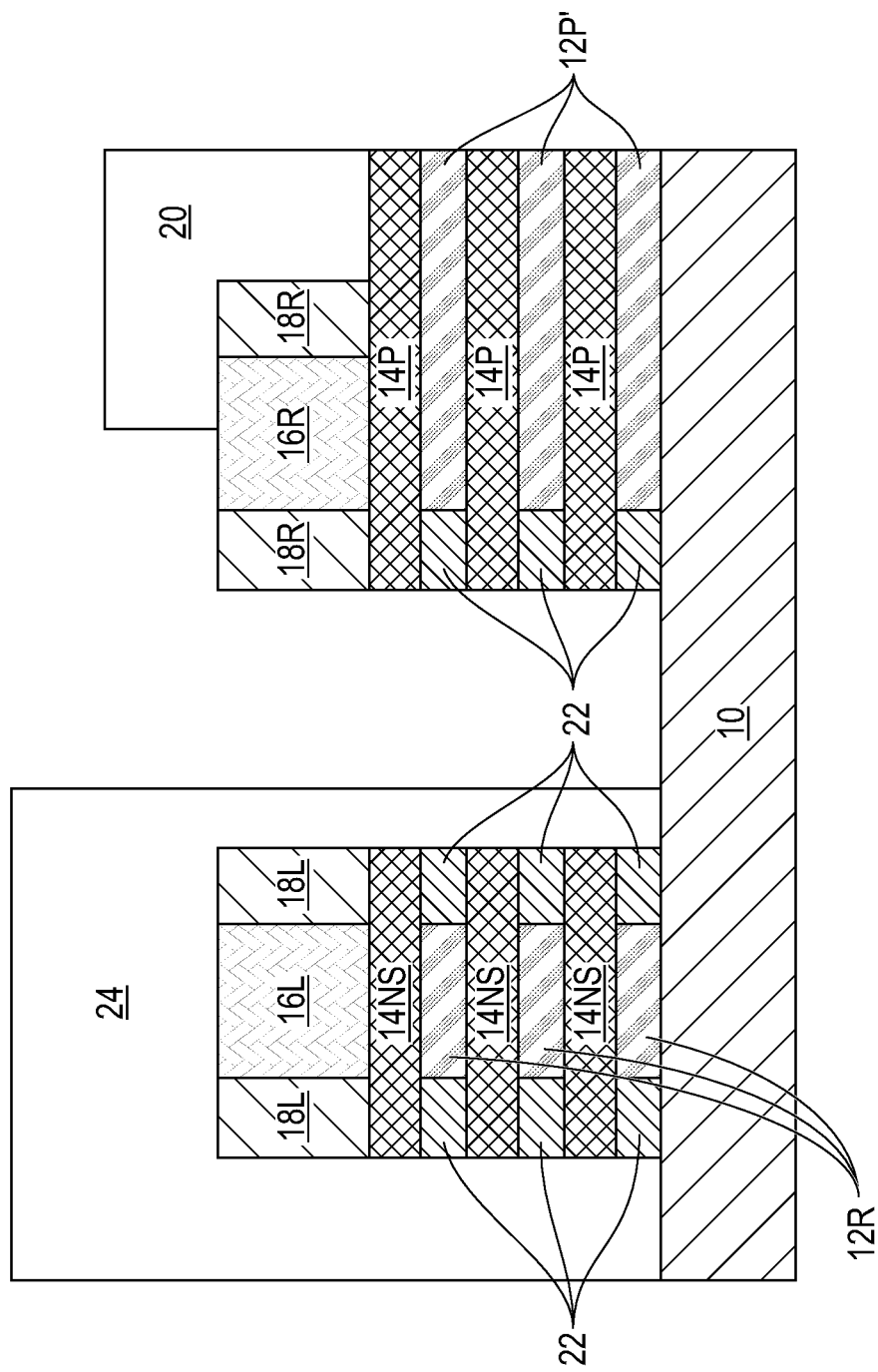
FIG. 5 is a cross sectional view of the exemplary semiconductor structure of FIG. 4 after forming a second mask protecting the first sacrificial gate structure, the nanosheet stack, the inner spacers formed within the gap formed by recessing the sacrificial semiconductor material nanosheets of the nanosheet stack.

Referring now to FIG. 5, there is illustrated the exemplary semiconductor structure of FIG. 4 after forming a second mask 24 protecting the first sacrificial gate structure 16L, the first gate spacer 18L, the nanosheet stack NS, and the inner spacer 22 formed within the gaps formed by recessing the sacrificial semiconductor material nanosheets of the nanosheet stack, NS. The second mask 24 is composed of a dielectric hard mask material that is compositionally different from the hard mask material that provides the first mask 20, the inner spacer dielectric material that provides each inner spacer 22, and the dielectric spacer material that provides the first and second gate spacers (18L, 18R). The second mask 24 may be formed by deposition and lithography. Alternatively, the second mask 24 may be composed of a photoresist material that is formed by deposition, and patterned by lithography.

Figure 6:
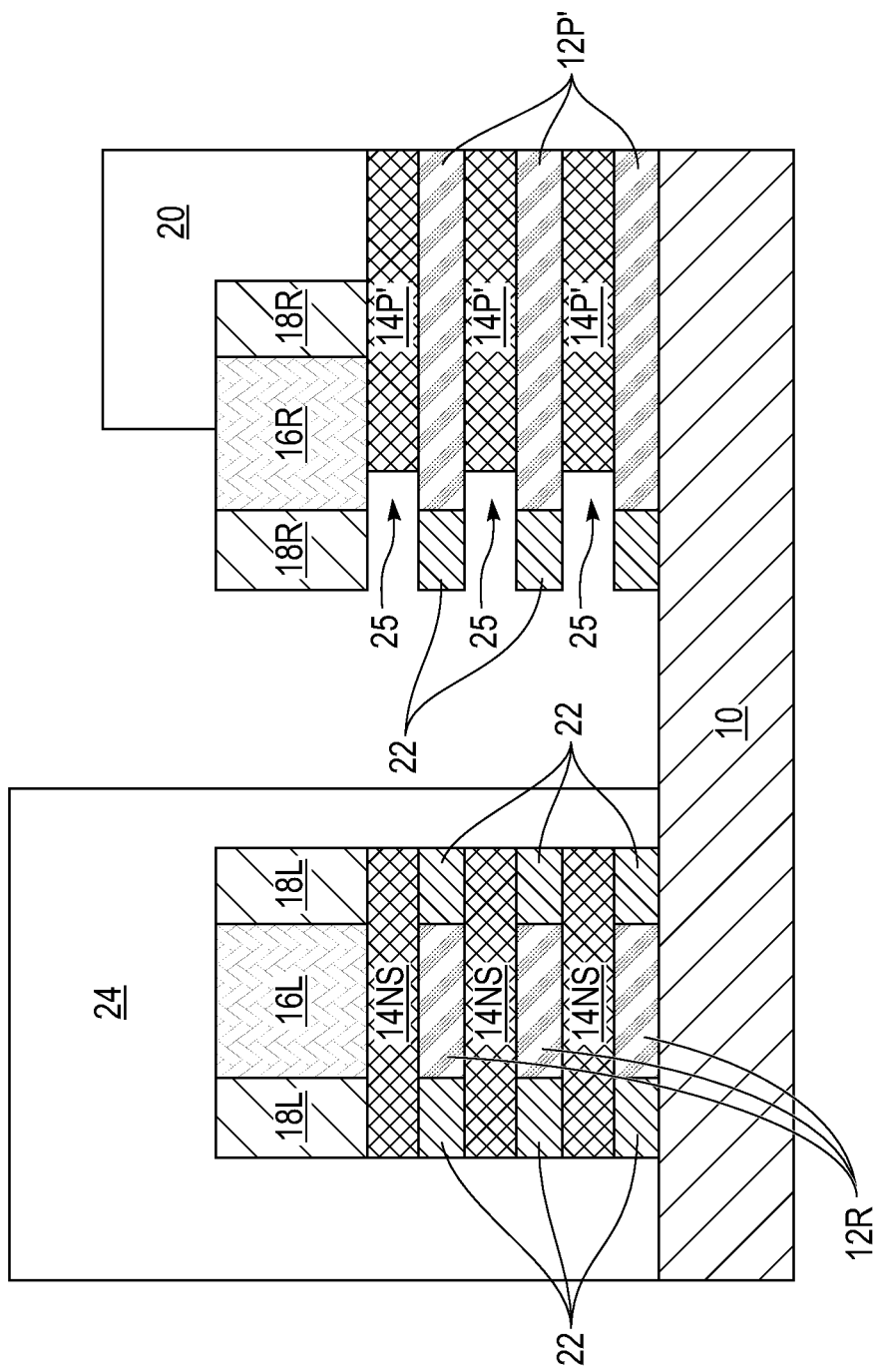
FIG. 6 is a cross sectional view of the exemplary semiconductor structure of FIG. 5 after recessing the semiconductor channel material layer portions of the material stack.

Referring now to FIG. 6, there is illustrated the exemplary semiconductor structure of FIG. 5 after recessing the semiconductor channel material layer portions 14P of the material stack, MS, to provide recessed semiconductor channel material layer portions 14P'. The recessing of the semiconductor channel material layer portions 14P of the material stack, MS, may be performed utilizing a lateral etching process. A gap 26 is formed during the recessing the semiconductor channel material layer portions 14P of the material stack, MS. Gap 25 is formed above and below each recessed sacrificial semiconductor material layer portion 12P', and only on the side of the material stack, MS, that faces the first sacrificial gate structure 16L. Each recessed semiconductor channel material portion 14P' has a width that is less than the width each recessed sacrificial semiconductor material layer portion 12P'.

Figure 7:
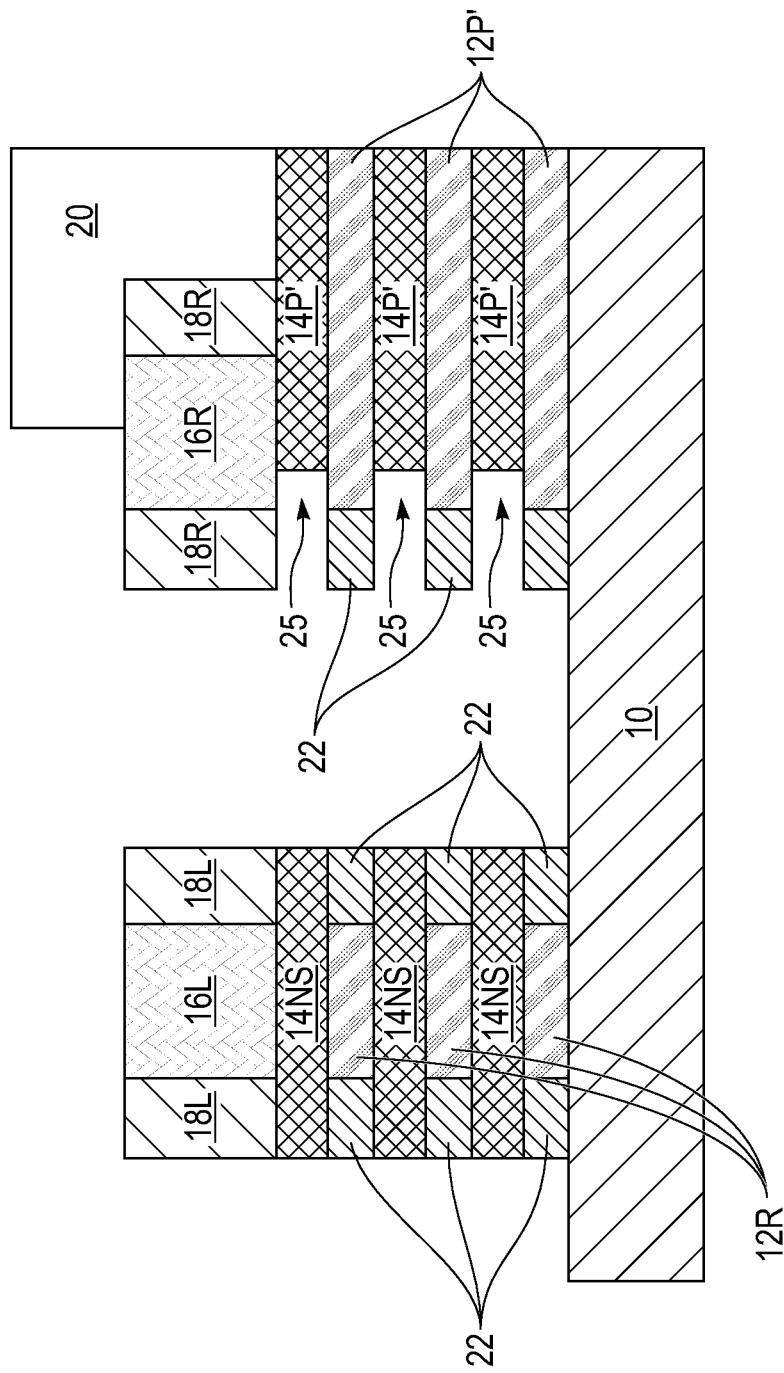
FIG. 7 is a cross sectional view of the exemplary semiconductor structure of FIG. 6 after removing the second mask.

Referring now to FIG. 7, there is illustrated the exemplary semiconductor structure of FIG. 6 after removing the second mask 24. The second mask 24 can be removed utilizing an etching process that is selective in removing the second mask 24.

Figure 8:
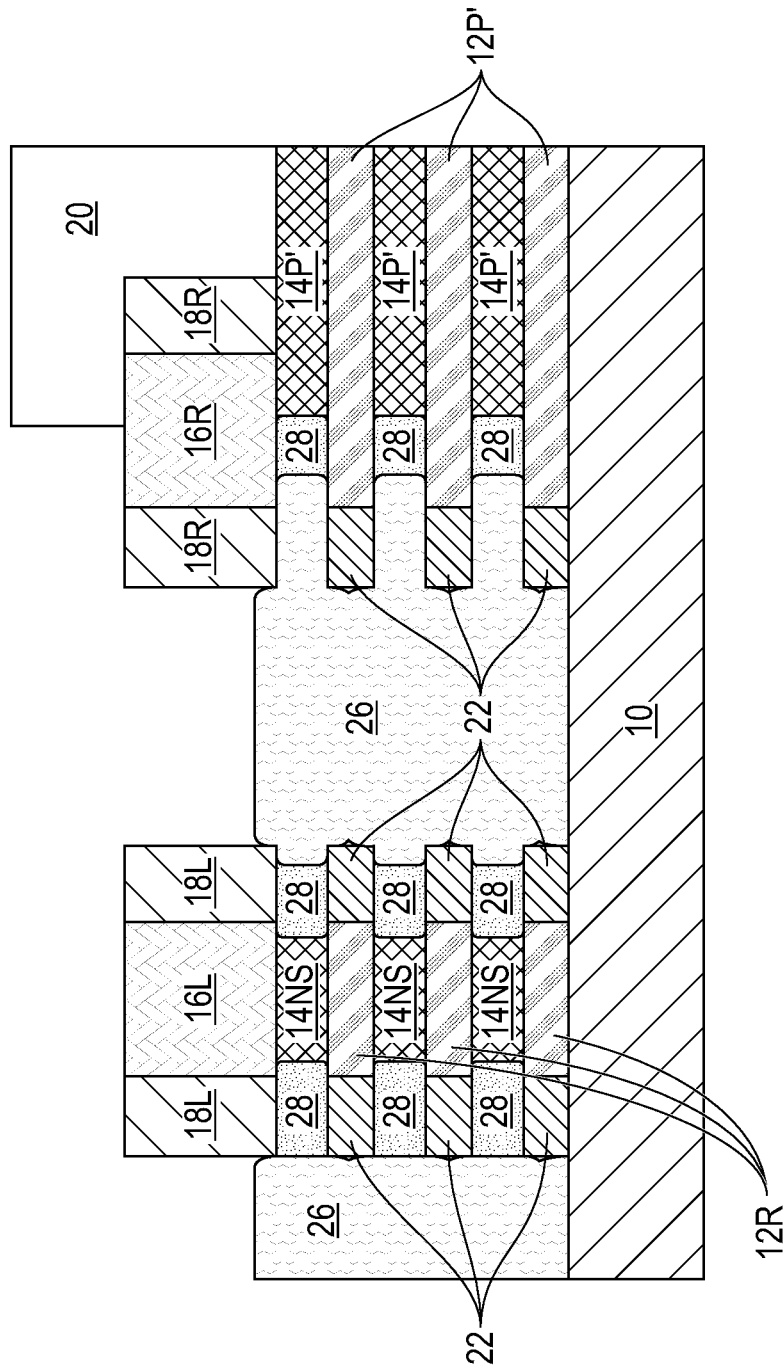
FIG. 8 is a cross sectional view of the exemplary semiconductor structure of FIG. 7 after forming a source/drain (S/D) region on physically exposed sidewalls of each semiconductor channel material nanosheet of the nanosheet stack and each recessed semiconductor channel material layer portion of the material stack, and performing a diffusion anneal.

Referring now to FIG. 8, there is illustrated the exemplary semiconductor structure of FIG. 7 after forming a source/drain (S/D) region 26 by epitaxial growth on physically exposed sidewalls of each semiconductor channel material nanosheet 14NS of the nanosheet stack, NS, and each recessed semiconductor channel material layer portion 14P' of the material stack, MS, and performing a diffusion anneal. The S/D region 26 fills in gap 25.

Each S/D region 26 includes a semiconductor material and a dopant. The semiconductor material that provides each S/D region 26 can be selected from one of the semiconductor materials mentioned above for the semiconductor substrate 10. In some embodiments of the present application, the semiconductor material that provides each S/D region 26 may comprise a same semiconductor material as that which provides the semiconductor channel material layer 14 (and thus each semiconductor channel material nanosheet, 14NS, and each recessed semiconductor channel material layer portion 14P'). In other embodiments of the present application, the semiconductor material that provides each S/D region 26 may comprise a different semiconductor material than that which provides each semiconductor channel material layer 14 (and thus each semiconductor channel material nanosheet, 14NS, and each recessed semiconductor channel material layer portion 14P'). For example, the semiconductor material that provides each S/D region 26 may comprise a silicon germanium alloy, while each semiconductor channel material layer 14 (and thus each semiconductor channel material nanosheet, 14NS, and each recessed semiconductor channel material layer portion 14P') may be composed of silicon.

The dopant that is present in each S/D region 26 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each S/D region 26 can be introduced into the precursor gas that provides each S/D region 26. In another embodiment, the dopant can be introduced into an intrinsic semiconductor layer by utilizing one of ion implantation or gas phase doping. In one example, each S/D region 26 comprises a silicon germanium alloy that is doped with a p-type dopant such as, for example, boron. The dopant concentration in each S/D region 26 is typically from $4\times10^{20}$ atoms/cm$^3$ to $3\times10^{21}$ atoms/cm$^3$. As mentioned above, each S/D region 26 is formed by an epitaxial growth (or deposition) process, as is defined above. In some embodiments, each S/D region 26 has a faceted upper surface.

The diffusion anneal causes diffusion of dopants from each S/D region 26 into a portion of each semiconductor channel material nanosheet, 14NS, and each recessed semiconductor channel material layer portion 14P' forming a source/drain (S/D) junction 28 between a remaining portion of each semiconductor channel material nanosheets, 14NS, and a remaining portion of each recessed semiconductor channel material layer portion 14P'. The diffusion anneal may be performed at a temperature from 800° C. to 1150° C. Each S/D junction 28 includes the second semiconductor material, and the out-diffused dopant from the S/D regions 26.

It is noted that within the region in which the gate-all-around nanosheet CMOS device is to be formed, a S/D region 26 is present on each sidewall of the nanosheet stack, NS, while in the region in which the resistive memory device is to be formed a single S/D region 26 is formed. This single S/D region 26 of the subsequently formed resistive memory device faces the region in which the gate-all-around nanosheet CMOS device will be subsequently formed. Also, this single S/D region 26 of the resistive memory device will be shared with the gate-all-around nanosheet CMOS device.

Figure 9:
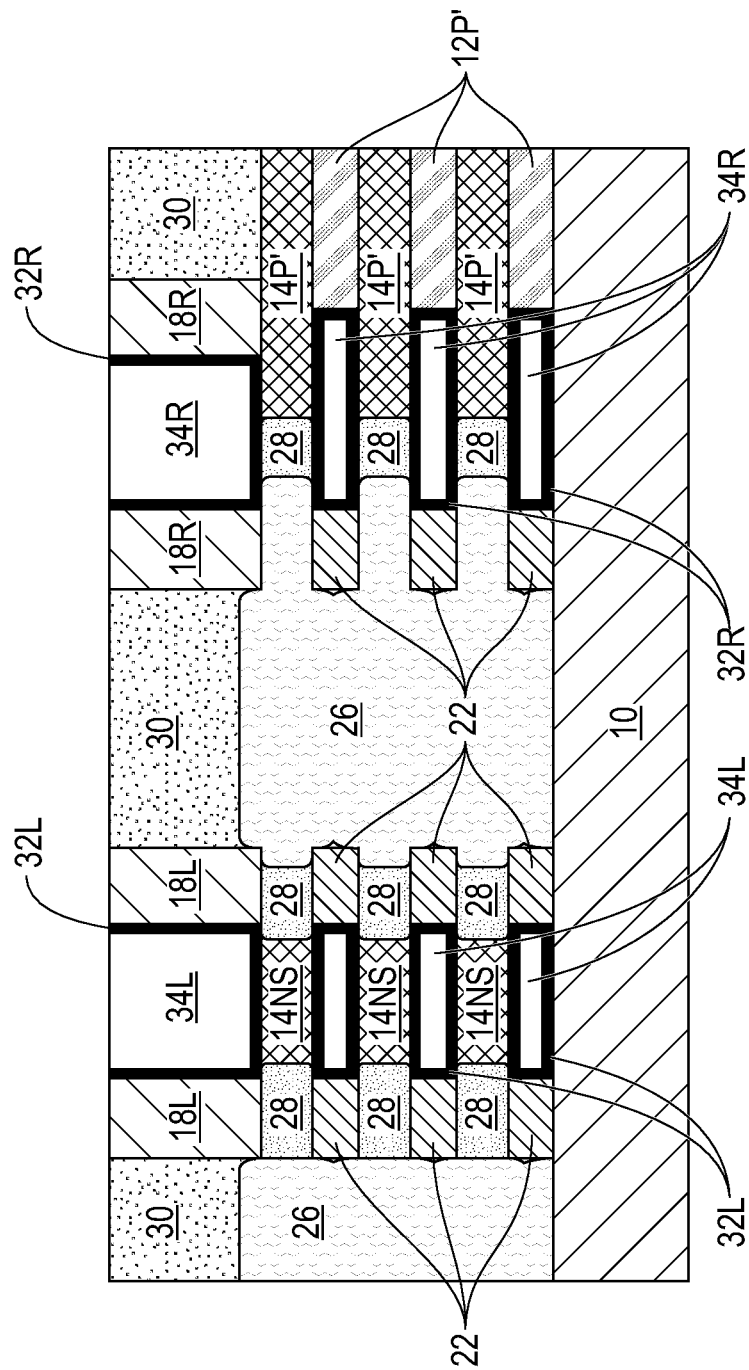
FIG. 9 is a cross sectional view of the exemplary semiconductor structure of FIG. 8 after removing the first mask, forming an interlayer dielectric (ILD) material, removing the first and second sacrificial gate structures, each recessed sacrificial semiconductor material nanosheet and a portion of each recessed sacrificial semiconductor material layer portion, and forming a first functional gate structure wrapping around each suspended semiconductor channel material nanosheet, and a second functional gate structure located on exposed surfaces of each recessed semiconductor channel material layer portion of the material stack.

Referring now to FIG. 9, there is illustrated the exemplary semiconductor structure of FIG. 8 after removing the first mask 20 utilizing an etching process that is selective in removing the first mask 20. Next, an interlayer dielectric (ILD) material 30 is formed atop the S/D regions 26 and laterally surrounding the sacrificial gate structures (16L, 16R). The ILD material 30 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 30. The use of a self-planarizing dielectric material as the ILD material 30 may avoid the need to perform a subsequent planarizing step.

In one embodiment, the ILD material 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 30, a planarization process or an etch back process follows the deposition of the dielectric material that provides the ILD material 30. The ILD material 30 that is present atop each S/D region 26 has a topmost surface that is coplanar with a topmost surface of the sacrificial gate structures (16L, 16R).

Next, the first and second sacrificial gate structures (18L, 18R) are removed utilizing one or more etching steps; and thereafter each recessed sacrificial semiconductor material nanosheet 12R and a portion of each recessed sacrificial semiconductor material layer portion 12P' are then removed utilizing an etching process.

A first functional gate structure (32L, 34L) is then formed surrounding physically exposed surfaces of each semiconductor channel material nanosheet 14P. By "functional gate structure" it is meant a permanent gate structure used to control output current (i.e., flow of carriers in the channel) of a semiconducting device through electrical or magnetic fields. Also, formed is a second functional gate structure (32R, 34R) on physically exposed surfaces of the recessed semiconductor channel material layer portion 14P'. The second functional gate structure (32R, 34R) is located in the area previously occupied by the second sacrificial gate structure 18R and in areas in which the recessed sacrificial semiconductor material layer portion 12P' was removed.

The first functional gate structure (32L, 34L) may include a gate dielectric material 32L and a gate conductor material 34L, the second functional gate structure (32R, 34R) also includes a gate dielectric material 32R and a gate conductor material 34L. The gate dielectric material 32L, 32R may include a dielectric metal oxide, a dielectric metal nitride and/or a dielectric metal oxynitride. In one example, the gate dielectric material 32L, 32R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate dielectric material 32L, 32R can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material 32L, 32R can have a thickness in a range from 1 nm to 10 nm. Other thicknesses that are lesser than, or greater than, the aforementioned thickness range can also be employed for the gate dielectric material that may provide the gate dielectric material 32L, 32R.

The gate conductor material 34L, 34R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material 34L, 34R may comprise an nFET gate metal. In another embodiment, the gate conductor material 34L, 34R may comprise a pFET gate metal.

The gate conductor material 34L, 34R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor material 34L, 34R can have a thickness from 50 nm to 200 nm. Other thicknesses that are lesser than, or greater than, the aforementioned thickness range can also be employed for the gate conductor material used in providing the material 34L, 34R.

The functional gate structures can be formed by providing a gate material stack of the gate dielectric material, and the gate conductor material. A planarization process may follow the formation of the functional gate material stack.

FIG. 9 (and FIGS. 10-11 that follow) illustrates a semiconductor structure of the present application. The semiconductor structure includes a gate-all-around nanosheet complementary metal-oxide-semiconductor (CMOS) device (located on the far left hand side of the drawing) comprising a first functional gate structure (32L, 34L) present on, and between, each semiconductor channel material nanosheet 14NS of a vertical stack of suspended semiconductor channel material nanosheets 14NS. The structure of the present application further includes a resistive memory device located laterally adjacent to the gate-all-around nanosheet CMOS device (see the far right hand side of the drawing) and comprising a second functional gate structure (32R, 34R) present on, and between, each recessed semiconductor channel material layer portion 14P' of a vertical material stack, MS, wherein a recessed sacrificial semiconductor material portion 12P' is located between each recessed semiconductor channel material layer portion 14P'. A shared source/drain region (S/D region 26 in the middle of the drawing) is located between the gate-all-around nanosheet CMOS device and the resistive memory device. The resistive memory device of the present application has an enhanced field at the corners of the recessed semiconductor channel material layer portion 14P' (See, FIG. 11) that facilitates the electroforming of a filament of the resistive memory device.

Referring now to FIG. 10, there is illustrated the exemplary semiconductor structure of FIG. 9 after forming additional ILD material and forming S/D contact structures 36A, gate contact structures 26C and a dummy contact structure 36B. Collectively, ILD material 30 and the additional ILD material may be referred to herein as ILD material 31. The additional ILD material may include a same or different dielectric material as ILD material 30. Thus, and in embodiments in which the additional ILD material is composed of a same dielectric material as ILD material 30, the ILD material 31 is composed entirely of a same dielectric material. In other embodiments in which the additional ILD material is composed of a different dielectric than ILD material 30, the ILD material 31 includes a lower portion composed of ILD material 30 and an upper portion composed of the additional ILD material. In the drawings of the present application, the upper portion of ILD material 31 represents the portion of ILD material 31 that is located above the first functional gate structure and the second functional gate structure. The additional dielectric material can be formed utilizing one of the techniques mentioned above in forming the ILD material 30.

After forming the additional ILD material, source/drain contact openings, gate contact openings, and dummy contact openings are formed into ILD material 31 by lithography and etching. The source/drain contact openings extend down to a topmost surface of the S/D regions 26, the contact openings extend down to a topmost surface of gate conductive material 34L, 34R, while dummy contact opening extends down to a topmost surface of the topmost recessed semiconductor channel material layer portion 14P'. Each contact opening is then filled with at least a contact metal or a contact metal alloy to form the S/D contact structures 36A, the gate contact structures 26C and dummy contact structure 36B. Exemplary contact metals or contact metal alloys include, for example, W, Co, Al, Cu or a Al—Cu alloy. A planarization process may follow the filling of each contact opening with the contact metal or metal alloy. Each of the S/D contact structures 36A, the gate contact structures 26C and the dummy contact structure 36B has a topmost surface that is coplanar with one another as well as being coplanar with a topmost surface of the ILD material 31.

Referring now to FIG. 11, there is illustrated an enlarged cross sectional view of the exemplary structure of FIG. 10 across the recessed semiconductor channel material layer portions 14P' illustrating the high field corners of the resistive memory device of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   providing a fin structure comprising a vertical stack of alternating layers of a sacrificial semiconductor material layer and a semiconductor channel material layer located on a surface of a semiconductor substrate, and a first sacrificial gate structure and a second sacrificial gate structure located on different portions of the fin structure.
   forming a first mask partially covering the second sacrificial gate structure;
   etching physically exposed portions of the fin structure to provide a nanosheet stack comprised of alternating nanosheets of a sacrificial semiconductor material nanosheet and a semiconductor channel material nanosheet beneath the first sacrificial gate structure, and a material stack of alternating layers of a sacrificial semiconductor material layer portion and a semiconductor channel material layer portion beneath the second sacrificial gate structure and the first mask;
   recessing each sacrificial semiconductor material nanosheet of the nanosheet stack and each sacrificial semiconductor material layer portion of the material stack;
   forming an inner spacer within a gap formed by the recessing;
   forming a second mask protecting the first sacrificial gate structure, the nanosheet stack, the inner spacers formed within the gap formed by recessing the sacrificial semiconductor material nanosheets of the nanosheet stack;
   recessing the semiconductor channel material layer portions of the material stack;
   removing the second mask;
   forming a source/drain (S/D) region on physically exposed sidewalls of each semiconductor channel material nanosheet of the nanosheet stack and a S/D region on a physically exposed sidewall of each recessed semiconductor channel material layer portion of the material stack;
   removing the first mask;
   removing the first and second sacrificial gate structures, each recessed sacrificial semiconductor material nanosheet and a portion of each recessed sacrificial semiconductor material layer portion; and
   forming a first functional gate structure wrapping around each suspended semiconductor channel material nanosheet, and a second functional gate structure on exposed surfaces of each recessed semiconductor channel material layer portion of the material stack.

2. The method of claim 1, further comprising forming, after the removing of the second mask, an interlayer dielectric (IlD) material surrounding the first and second sacrificial gate structures.

3. The method of claim 2, further comprising forming, after the forming of the first and second functional gate structures, an additional ILD material onto the ILD material and the first and second functional gate structures.

4. The method of claim 3, further comprising forming, in any order, a source/drain contact structure directly contacting each S/D region, a first gate contact structure directly contacting the first gate structure, a second gate contact structure directly contacting the second gate structure, and a dummy gate contact structure directly contacting a topmost recessed semiconductor channel material layer portion of the material stack.

5. The method of claim 1, wherein the forming of the S/D regions comprises an epitaxial growth process.

6. The method of claim 1, further comprising performing a diffusion anneal to out-diffuse dopant from the S/D regions and into a portion of each of the semiconductor channel material nanosheets and each of the recessed semiconductor channel material layer portions.

7. The method of claim 1, wherein each of the recessed semiconductor channel material layer portions has a width that is greater than a width of each of the sacrificial semiconductor material layer portions.

8. The method of claim 1, wherein the second functional gate structure located on the exposed surfaces of each of the recessed semiconductor channel material layer portions of the material stack constituents a resistive memory device.

9. The method of claim 8, wherein the recessed semiconductor channel material layer portions have sharp corners that facilitate electroforming of a filament of the resistive memory device.

10. The method of claim 1, wherein each sacrificial semiconductor material is composed of a silicon germanium alloy, and each semiconductor channel material layer is composed of silicon or a III-V compound semiconductor.

11. The method of claim 1, wherein the providing of the fin structure comprises:
epitaxially growing a semiconductor material stack of the alternating layers of the semiconductor material layer and the semiconductor channel material layer; and
patterning the semiconductor material stack.

12. The method of claim 1, further comprising forming a gate spacer on a sidewall of the first and second sacrificial gate structures, wherein the gate spacer straddles over the fin structure.

13. The method of claim 1, wherein the recessing of each sacrificial semiconductor material sheet of the nanosheet stack and each sacrificial semiconductor layer portion of the material stack comprises a lateral etch.

14. The method of claim 13, wherein the lateral etch occurs inward from both sidewalls of each sacrificial semiconductor material sheet of the nanosheet stack, and wherein the lateral etch only occurs from a sidewall of each sacrificial semiconductor material layer portion that faces the first sacrificial gate structure.

15. The method of claim 1, wherein the recessing of semiconductor channel material layers portions of the material stack forms a gap located above and below each recessed sacrificial semiconductor material layer portion, wherein the gap is located only on one side of the material stack that faces the first sacrificial gate structure.

16. The method of claim 1, wherein the S/D region that is formed on the sidewall of each of the semiconductor channel material layer portions of the material stack is located on a side of the material stack facing the first sacrificial gate structure.

17. The method of claim 4, wherein each source/drain contact structure, each gate contact structure and the dummy contact structure have a topmost surface that is coplanar with each other.

18. A method of forming a semiconductor structure, the method comprising:
providing a fin structure comprising a vertical stack of alternating layers of a sacrificial semiconductor material layer and a semiconductor channel material layer located on a surface of a semiconductor substrate, and a first sacrificial gate structure and a second sacrificial gate structure located on different portions of the fin structure.

forming a first mask partially covering the second sacrificial gate structure;

etching physically exposed portions of the fin structure to provide a nanosheet stack comprised of alternating nanosheets of a sacrificial semiconductor material nanosheet and a semiconductor channel material nanosheet beneath the first sacrificial gate structure, and a material stack of alternating layers of a sacrificial semiconductor material layer portion and a semiconductor channel material layer portion beneath the second sacrificial gate structure and the first mask;

recessing each sacrificial semiconductor material nanosheet of the nanosheet stack and each sacrificial semiconductor material layer portion of the material stack;

forming an inner spacer within a gap formed by the recessing;

forming a second mask protecting the first sacrificial gate structure, the nanosheet stack, the inner spacers formed within the gap formed by recessing the sacrificial semiconductor material nanosheets of the nanosheet stack;

recessing the semiconductor channel material layer portions of the material stack, wherein the recessed semiconductor channel material layer portions have sharp corners that facilitate electroforming of a filament of a resistive memory device;

removing the second mask;

forming a source/drain (S/D) region on physically exposed sidewalls of each semiconductor channel material nanosheet of the nanosheet stack and a S/D region on a physically exposed sidewall of each recessed semiconductor channel material layer portion of the material stack;

removing the first mask;

removing the first and second sacrificial gate structures, each recessed sacrificial semiconductor material nanosheet and a portion of each recessed sacrificial semiconductor material layer portion; and forming a first functional gate structure wrapping around each suspended semiconductor channel material nanosheet, and a second functional gate structure on exposed surfaces of each recessed semiconductor channel material layer portion of the material stack.

19. The method of claim 18, further comprising forming, in any order, a source/drain contact structure directly contacting each S/D region, a first gate contact structure directly contacting the first gate structure, a second gate contact structure directly contacting the second gate structure, and a dummy gate contact structure directly contacting a topmost recessed semiconductor channel material layer portion of the material stack.

20. The method of claim 19, wherein each of the source/drain contact structure, the first gate contact structure, the second gate contact structure and the dummy gate contact structure are embedded in an interlayer dielectric material, and have a topmost surface that is coplanar with each other and coplanar with a topmost surface of the interlayer dielectric material.

* * * * *